United States Patent
Hart et al.

(10) Patent No.: US 10,861,848 B2
(45) Date of Patent: Dec. 8, 2020

(54) SINGLE EVENT LATCH-UP (SEL) MITIGATION TECHNIQUES

(71) Applicant: Xilinx, Inc., San Jose, CA (US)

(72) Inventors: Michael J. Hart, Palo Alto, CA (US); James Karp, Saratoga, CA (US); Mohammed Fakhruddin, San Jose, CA (US); Pierre Maillard, Campbell, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/110,894

(22) Filed: Aug. 23, 2018

(65) Prior Publication Data

US 2020/0066713 A1   Feb. 27, 2020

(51) Int. Cl.
| | | |
|---|---|---|
| H01L 27/06 | (2006.01) | |
| H01L 27/02 | (2006.01) | |
| H01L 49/02 | (2006.01) | |
| H01L 29/73 | (2006.01) | |
| H01L 29/78 | (2006.01) | |

(52) U.S. Cl.
CPC ...... *H01L 27/0635* (2013.01); *H01L 27/0262* (2013.01); *H01L 27/0288* (2013.01); *H01L 28/20* (2013.01); *H01L 29/7304* (2013.01); *H01L 29/785* (2013.01)

(58) Field of Classification Search
CPC . H01L 27/0262; H01L 29/7304; H01L 28/20; H01L 27/0635; H01L 29/785; H01L 27/0288
See application file for complete search history.

(56) References Cited

U.S. PATENT DOCUMENTS

| | | | | |
|---|---|---|---|---|
| 4,672,584 A | * | 6/1987 | Tsuji | H01L 27/0921 257/372 |
| 5,903,424 A | * | 5/1999 | Tailliet | H01L 27/0259 361/111 |
| 5,936,429 A | * | 8/1999 | Tomita | H03K 5/153 326/82 |
| 2006/0258067 A1 | * | 11/2006 | Jeon | H01L 29/7436 438/154 |

OTHER PUBLICATIONS

Karp, J. et al., "Single-Event Latch-Up: Increased Sensitivity From Planar to FinFET", IEEE Trans. Nucl. Sci., vol. 65, Issue 1, pp. 217-222, Jan. 2018.

* cited by examiner

*Primary Examiner* — Thanh Y. Tran
(74) *Attorney, Agent, or Firm* — Patterson + Sheridan, LLP

(57) ABSTRACT

Examples described herein provide for single event latch-up (SEL) mitigation techniques. In an example, a circuit includes a semiconductor substrate, a first transistor, a second transistor, and a ballast resistor. The semiconductor substrate comprises a p-doped region and an n-doped region. The first transistor comprises an n+ doped source region disposed in the p-doped region of the semiconductor substrate. The second transistor comprises a p+ doped source region disposed in the n-doped region of the semiconductor substrate. The p+ doped source region, the n-doped region, the p-doped region, and the n+ doped source region form a PNPN structure. The ballast resistor is electrically connected in series with the PNPN structure between a power node and a ground node.

14 Claims, 4 Drawing Sheets

SINGLE EVENT LATCH-UP (SEL) MITIGATION TECHNIQUES

TECHNICAL FIELD

Examples of the present disclosure generally relate to integrated circuits and, in particular, to mitigation of single event latch-up (SEL) on integrated circuits.

BACKGROUND

Single event latch-up (SEL) is generally an abnormal high-current state in a device caused by the passage of an energetic particle through sensitive regions of the device structure. SEL can result in the loss of device functionality. In complementary device structures in integrated circuits (such as in complementary metal-oxide-semiconductor (CMOS) structures), SEL can result in a parasitic silicon controlled rectifier (SCR) structure turning on to conduct a current. When the parasitic SCR structure is turned on, a voltage drop across the parasitic SCR structure can result in the parasitic SCR structure continuing to conduct the current. The continuous conduction of the current can damage the integrated circuit, such as by generating heat that can cause melting of components, migration of metal, or other problems.

SUMMARY

Examples described herein provide for single event latch-up (SEL) mitigation techniques. In examples describe herein, one or more ballast resistors are implemented in series with a parasitic silicon controlled rectifier (SCR) structure (e.g., that includes PNPN junctions) between a power node and a ground node. In some examples, the ballast resistor can cause a parasitic SCR structure to turn off after occurrence of the SEL without a power cycle and without implementing a guard ring.

An example of the present disclosure is a circuit. The circuit includes a semiconductor substrate, a first transistor, a second transistor, and a ballast resistor. The semiconductor substrate comprises a p-doped region and an n-doped region. The first transistor comprises an n+ doped source region disposed in the p-doped region of the semiconductor substrate. The second transistor comprises a p+ doped source region disposed in the n-doped region of the semiconductor substrate. The p+ doped source region, the n-doped region, the p-doped region, and the n+ doped source region form a PNPN structure. The ballast resistor is electrically connected in series with the PNPN structure between a power node and a ground node.

Another example of the present disclosure is a circuit. The circuit includes a parasitic silicon controlled rectifier and a ballast resistor. The parasitic silicon controlled rectifier is in a substrate. Portions of complementary transistors are disposed in the substrate, and regions of the complementary transistors form at least a portion of the parasitic silicon controlled rectifier. The parasitic silicon controlled rectifier is electrically coupled between a power node and a ground node. The ballast resistor is electrically coupled in series with the parasitic silicon controlled rectifier between the power node and the ground node. The ballast resistor has a resistance greater than 2 Ohms.

A further example of the present disclosure is a circuit. The circuit includes an n-type transistor, a p-type transistor, and a ballast resistor. The n-type transistor comprises an n-type source region disposed in a p-type region in a substrate. The p-type transistor comprises a p-type source region disposed in an n-type region in the substrate. The n-type region abuts the p-type region. The p-type source region, the n-type region, the p-type region, and the n-type source region form a parasitic silicon controlled rectifier in the substrate. The ballast resistor has a resistance greater than 2 Ohms. The ballast resistor and the parasitic silicon controlled rectifier are electrically coupled in series between a power node and a ground node.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
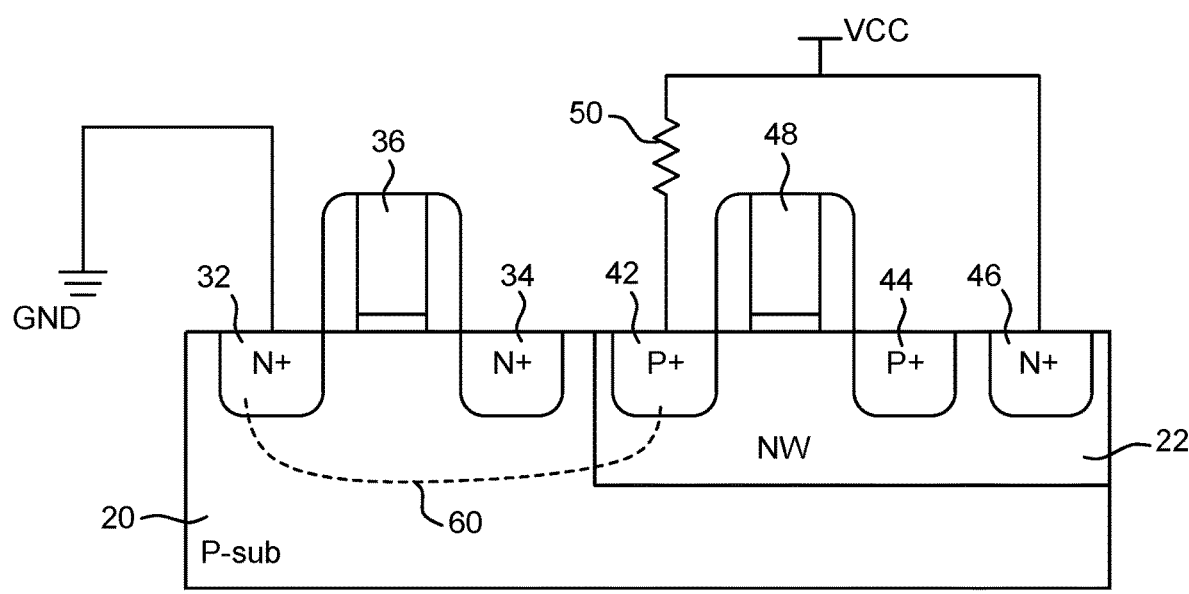
FIG. 1 is a schematic diagram of a single event latch-up (SEL) mitigation technique according to an example.

Examples described herein provide for single event latch-up (SEL) mitigation techniques. In examples describe herein, one or more ballast resistors are implemented in series with a parasitic silicon controlled rectifier (SCR) structure (e.g., that includes PNPN junctions) between a power node and a ground node. Current flowing through the parasitic SCR structure that is the result of a SEL can cause a voltage drop across the ballast resistor. The voltage drop across the ballast resistor can prevent the voltage across the parasitic SCR structure from reaching a hold voltage that would cause the parasitic SCR structure to continue conducting the current. Hence, the ballast resistor can cause a parasitic SCR structure to turn off after occurrence of the SEL without a power cycle and without implementing a guard ring.

Although examples described herein contemplate being implemented in planar technology, fin technology, or another technology, aspects described herein may be well suited for being implemented in fin technology. The transition from planar field effect transistors (FETs) to fin FETs (FinFETs) in complementary semiconductor structures (e.g., complementary metal-oxide-semiconductor (CMOS) structures) has changed attributes of the structures that contribute to SEL. Some attributes of FinFETs that have changed that can lead to an increase in occurrence and/or adverse effect of SEL in FinFETs include (i) shallower shallow trench isolations (STIs) between FinFETs compared to their planar counterparts, and (ii) higher bipolar gain ($\beta_{PNP} \times \beta_{NPN}$) of a parasitic SCR structure formed in FinFETs compared to their planar counterparts. Hence, SEL mitigation techniques, such as described herein, may be particularly applicable to FinFET technology.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 is a schematic diagram of a SEL mitigation technique according to an example. Complementary devices (e.g., an n-type field effect transistor (FET) and a p-type FET) are formed on a semiconductor substrate 20. The semiconductor substrate 20 includes a p-doped semiconductor material (e.g., a p-doped region). For example, the semiconductor substrate 20 can be silicon doped with a p-type dopant. Other semiconductor material can be implemented. The p-type dopant can be introduced into the semiconductor substrate 20 during formation of the ingot that is subsequently formed into the semiconductor substrate 20, by epitaxially growing a material on the semiconductor substrate 20 that is doped in situ with the p-type dopant, and/or by implantation of the p-type dopant into the semiconductor substrate 20 during processing. An n-well 22 is formed in the semiconductor substrate 20. The n-well 22 is formed where one or more p-type FETs are to be formed. The n-well 22 can be formed by implantation of an n-type dopant into the semiconductor substrate 20 and/or by etching the semiconductor substrate 20 and epitaxially growing a material that is doped in situ with n-type dopant. In some examples, the concentration of the n-type dopant in the n-well is greater, such as by an order of magnitude or more, than the concentration of the p-type dopant in the semiconductor substrate 20. The concentration of the p-type dopant in the semiconductor substrate 20 can be in a range from about $1 \times 10^{13}$ cm$^{-3}$ to about $5 \times 10^{13}$ cm$^{-3}$, and the concentration of the n-type dopant in the n-well 22 can be in a range from about $1 \times 10^{18}$ cm$^{-3}$ to about $5 \times 10^{18}$ cm$^{-3}$. In other examples, other configurations of doped regions (e.g., doped substrate and/or doped wells) can be implemented.

An n-type FET is formed in and/or on the semiconductor substrate 20. The n-type FET includes a source region 32, a drain region 34, and a gate 36. The source region 32 and drain region 34 each include an n+ doped region. The n+ doped regions can be formed by implantation of an n-type dopant and/or by etching the semiconductor substrate 20 and epitaxially growing a material that is doped in situ with n-type dopant. The source region 32 and drain region 34 can be self-aligned with the gate 36. The n-type FET further includes a channel region underlying the gate 36. The channel region is a portion of the p-doped semiconductor material of the semiconductor substrate 20. The concentration of the n-type dopant in the n+ doped regions of the source region 32 and drain region 34 is greater, such as by an order of magnitude or more, than the concentration of the p-type dopant in the semiconductor substrate 20. The concentration of the n-type dopant in the n+ doped regions of the source region 32 and drain region 34 can be in a range from about $1 \times 10^{19}$ cm$^{-3}$ to about $1 \times 10^{21}$ cm$^{-3}$.

A p-type FET is formed in and/or on the semiconductor substrate 20. The p-type FET includes a source region 42, a drain region 44, a body region 46, and a gate 48. The source region 42 and drain region 44 each include a p+ doped region disposed in the n-well 22 in the semiconductor substrate 20. The p+ doped regions can be formed by implantation of a p-type dopant and/or by etching the semiconductor substrate 20 and epitaxially growing a material that is doped in situ with p-type dopant. The source region 42 and drain region 44 can be self-aligned with the gate 48. The body region 46 includes an n+ doped region disposed in the n-well 22 in the semiconductor substrate 20. The n+ doped region can be formed by implantation of an n-type dopant and/or by etching the semiconductor substrate 20 and epitaxially growing a material that is doped in situ with n-type dopant. The p-type FET further includes a channel region underlying the gate 48. The channel region is a portion of the n-well 22 in the semiconductor substrate 20. The concentration of the p-type dopant in the p+ doped regions of the source region 42 and drain region 44 is greater, such as by an order of magnitude or more, than the concentration of the n-type dopant in the n-well 22. The concentration of the p-type dopant in the p+ doped regions of the source region 42 and drain region 44 can be in a range from about $1 \times 10^{19}$ cm$^{-3}$ to about $1 \times 10^{21}$ cm$^{-3}$. The concentration of the n-type dopant in the n+ doped region of the body region 46 is greater, such as by an order of magnitude or more, than the concentration of the n-type dopant in the n-well 22. The concentration of the n-type dopant in the n+ doped region of the body region 46 can be in a range from about $1 \times 10^{19}$ cm$^{-3}$ to about $1 \times 10^{21}$ cm$^{-3}$.

The gates 36 and 48 each include a conductive material (such as metal or doped polysilicon) and are disposed over a gate dielectric layer (not specifically numbered) on the semiconductor substrate 20. The gates 36 and 48 may each be disposed between opposing gate spacers (not specifically numbered). The gates 36 and 48 may be formed by a gate first process or a replacement gate process, as a person having ordinary skill in the art will readily understand.

The source region 32 is electrically connected to a ground node GND. The source region 32 can be electrically connected to the ground node GND via metal lines and vias formed in metallization layers on the semiconductor substrate 20. In some examples, the resistance of the metal lines and vias between the source region 32 and the ground node GND is less than 1 Ohm. The body region 46 is electrically connected to a power node VCC. The body region 46 can be electrically connected to the power node VCC via metal lines and vias formed in metallization layers on the semiconductor substrate 20. In some examples, the resistance of the metal lines and vias between the body region 46 and the power node VCC is less than 1 Ohm.

The source region 42 is electrically connected to a first terminal of a ballast resistor 50, and a second terminal of the ballast resistor 50 is electrically connected to the power node VCC. The ballast resistor 50 can be or include metal lines and vias in the metallization layers on the semiconductor substrate 20. The metal lines and vias that form the ballast resistor 50 can be formed with various geometries (e.g., lengths of metal lines, including a serpentine pattern of one or more metal lines in one or more metallization layers) and/or materials to achieve a target resistance between the source region 42 and the power node VCC. As discussed in further detail below, the ballast resistor 50 can be greater than 2 Ohms (e.g., 5 Ohms or more, such as 50 Ohms or more).

During a SEL, current can flow along a current path 60 in the semiconductor substrate 20. The current path 60 includes the p+ region of the source region 42, the n-well 22, the p-doped material of the semiconductor substrate 20, and the n+ region of the source region 32, which forms the PNPN junctions of a parasitic silicon controlled rectifier (SCR) structure.

Figure 2:
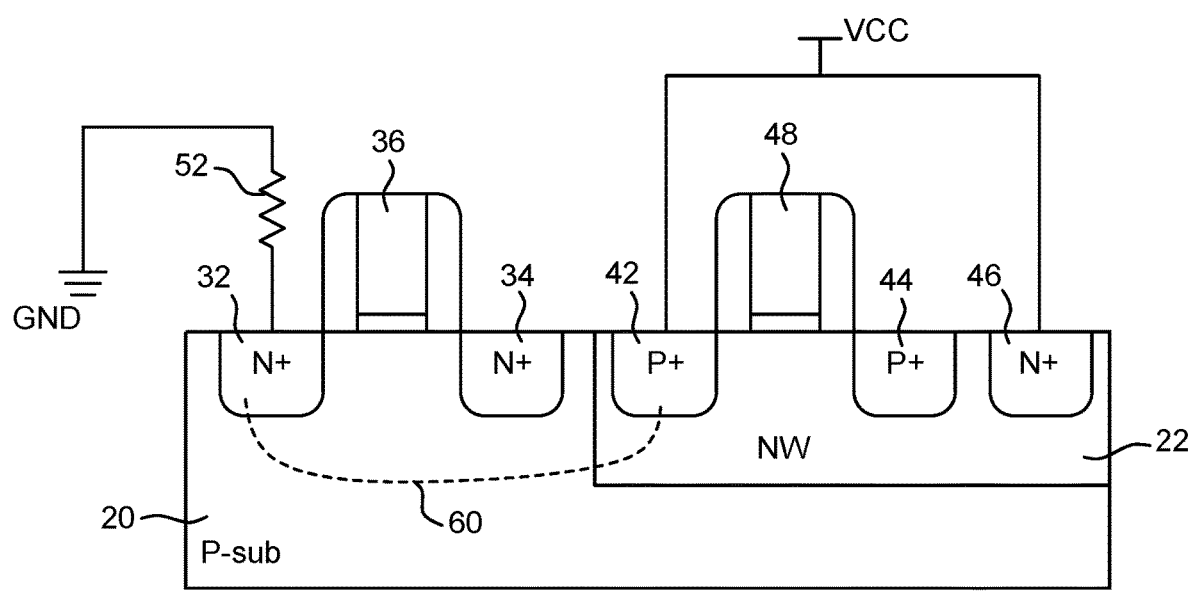
FIG. 2 is a schematic diagram of another SEL mitigation technique according to an example.

FIG. 2 is a schematic diagram of another SEL mitigation technique according to an example. FIG. 2 is similar to FIG. 1, except that the source region 42 is electrically connected to the power node VCC, the source region 32 is electrically connected to a first terminal of a ballast resistor 52, and a second terminal of the ballast resistor 52 is electrically connected to the ground node GND. The source region 42 can be electrically connected to the power node VCC via metal lines and vias formed in metallization layers on the semiconductor substrate 20. In some examples, the resistance of the metal lines and vias between the source region 42 and the power node VCC is less than 1 Ohm. The ballast resistor 52 can be or include metal lines and vias in the metallization layers on the semiconductor substrate 20. The metal lines and vias that form the ballast resistor 52 can be formed with various geometries (e.g., lengths of metal lines, including a serpentine pattern of one or more metal lines in one or more metallization layers) and/or materials to achieve a target resistance between the source region 32 and the ground node GND. As discussed in further detail below, the ballast resistor 52 can be greater than 2 Ohms (e.g., 5 Ohms or more, such as 50 Ohms or more).

Although FIGS. 1 and 2 are each illustrated as having a single ballast resistor, other examples can have multiple ballast resistors, such as having both of the ballast resistors 50 and 52.

Each of the FETs illustrated in FIGS. 1 and 2 can be implemented by a planar FET, by a fin FET (finFET), or by other technology. A finFET may include a fin in which the source and drain regions are formed and on which the gate is formed. The fin can protrude from the semiconductor substrate and thus have sidewalls and an upper surface. The gate can be formed along the sidewalls and on the upper surface of the fin to thereby increase the width of the channel relative to a planar FET with a same footprint.

It is contemplated that some examples do not include a guard ring around the FETs of FIGS. 1 and 2. Some examples may include one or more guard ring around one or both of the FETs of FIGS. 1 and 2.

Generally, latch-up in complementary FET structures (e.g. complementary metal-oxide-semiconductor (CMOS)) can be caused by the triggering of a parasitic SCR structure. SEL can be caused by transient current originating from charges generated along the track of an incident charged particle. The transition from planar technology to finFET technology has generally changed the parameters of the parasitic SCR structure, and has generally eased triggering of SEL. For example, as stated previously, the STIs between FETs are generally shallower for FinFETs than for planar FETs, and the bipolar gain ($\beta_{PNP} \times \beta_{NPN}$) of the parasitic SCR structure is generally greater for FinFETs than for planar FETs. SEL generally creates a current through a parasitic SCR structure that is electrically coupled between a power node and a ground node, and the current, once triggered, may continue to flow as long as a hold voltage is across the parasitic SCR structure.

Examples described herein, such as in FIGS. 1 and 2, include a ballast resistor that is in series with the current that may be triggered by a SEL. For example, in FIG. 1, current caused by SEL can flow from the power node VCC, through the ballast resistor 50, along the current path 60 (e.g., the parasitic SCR structure), and to the ground node GND. Further, for example, in FIG. 2, current caused by SEL can flow from the power node VCC, along the current path 60 (e.g., the parasitic SCR structure), through the ballast resistor 52, and to the ground node GND. The ballast resistors 50 and 52 each have a target resistance that causes a voltage drop across the respective ballast resistor 50 and 52 when the current caused by the SEL flows through the respective ballast resistor 50 and 52, and that voltage drop prevents the voltage across the parasitic SCR structure from reaching a hold voltage that would cause the parasitic SCR structure to continue conducting the current. Illustrated differently, assume that $V_{hold}$ is the hold voltage that would cause the parasitic SCR structure to continue conducting, I is the minimum current caused by a SEL (which current would flow through the parasitic SCR structure and the ballast resistor 50 and 52 due to the series connection), $V_{CC}$ is the voltage of the power node VCC, and R is the resistance of the ballast resistor 50 and 52. Under such assumptions, $V_{hold} > V_{CC} - IR$, which leads to $R > (V_{CC} - V_{hold})/I$. As an example, assume that $V_{CC}$ is 1.5 V, $V_{hold}$ is 1 V, and I is 10 mA. In such as case, R is greater than 50 Ohms. As another example, assume that $V_{CC}$ is 1.5 V, $V_{hold}$ is 1 V, and I is 100 mA. In such as case, R is greater than 5 Ohms.

In other designs without such ballast resistor, a power cycle would be implemented to remove (e.g., turn off) the power voltage from the parasitic SCR structure when a SEL would occur. By removing the power voltage from the parasitic SCR structure, the voltage across the parasitic SCR structure would be reduced below the hold voltage to thereby turn off the parasitic SCR structure. These power cycles would generally turn off the power to the entire chip or a much larger area of the chip than the local structures in which the SEL triggered the current through the parasitic SCR structure. In examples described herein, a ballast resistor may prevent a voltage across the parasitic SCR structure from reaching a hold voltage, and hence, can cause the parasitic SCR structure to be turned off after the SEL event. A power cycle to remove the power from the parasitic SCR structure may therefore be obviated. The increase in voltage drop across the ballast resistor caused by the current generated by the SEL may be considered a localized power cycle that is specific to the parasitic SCR structure through which the current flows.

In some circuit designs, a ballast resistor implemented as described herein may affect the functionality of the circuit. The ballast resistor may have a minimum resistance that would maintain $R > (V_{CC} - V_{hold})/I$ to minimize an effect on the circuit. Further, other components in the circuit may be modified to accommodate the presence of the ballast resistor. Example circuits in which a ballast resistor may be implemented include a current source, a low noise voltage regulator, and the like.

Examples described herein can be applied to a circuit having any power voltage $V_{CC}$. In some examples, the power voltage $V_{CC}$ is a high voltage such as 1.5 V or greater (e.g., 1.8 V or greater). Examples may easily scale between different power voltages based on the relationships described herein. Hence, examples may be applied to lower power voltage applications.

As stated previously, some examples contemplate that a guard ring is not implemented for the FETs in the SEL mitigation technique. Guard rings can consume a significant amount of area in a layout of a chip. By implementing a ballast resistor as described herein, effects of SEL can be mitigated without a guard ring, which can permit implementations of smaller area and/or more area efficient layouts on a chip.

Figure 3:
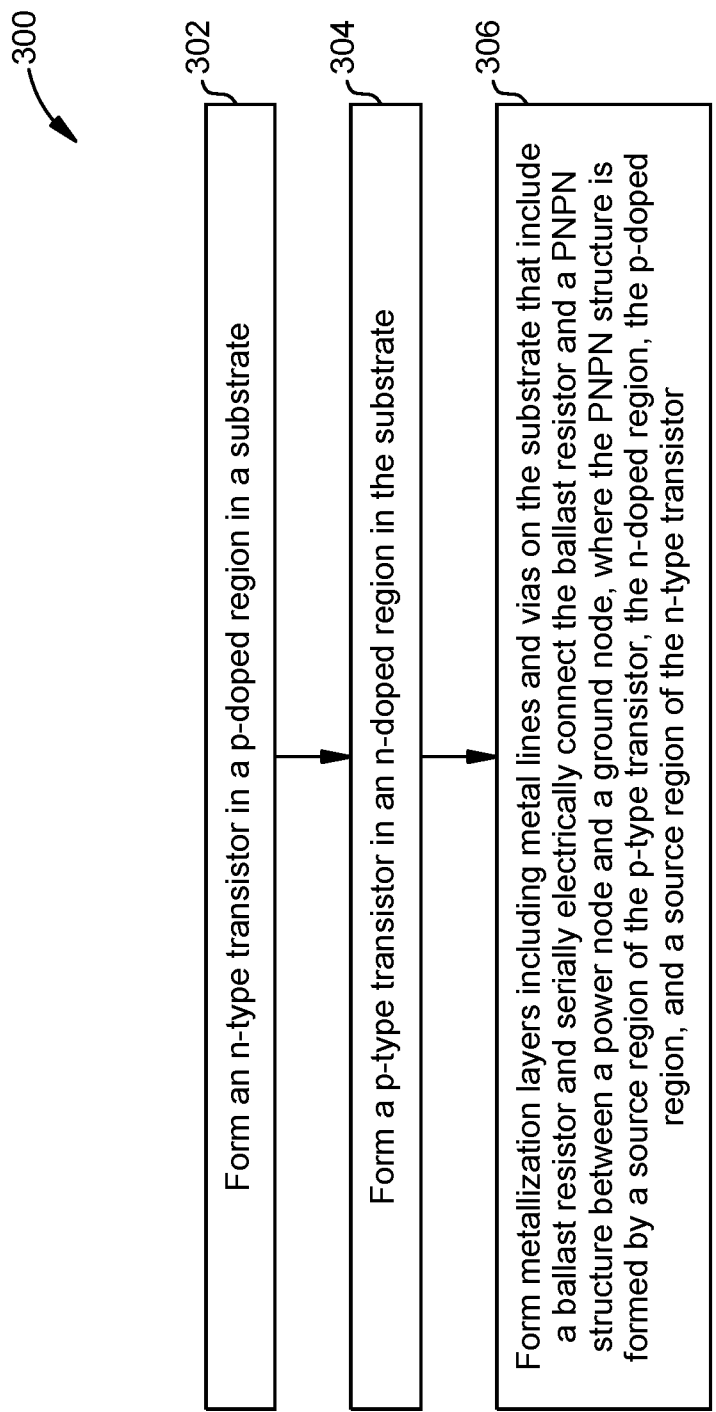
FIG. 3 is an example method 300 for implementing an SEL mitigation technique according to some examples.

FIG. 3 is an example method 300 for implementing an SEL mitigation technique according to some examples. In operation 302, an n-type transistor is formed in a p-doped region in a substrate. More specifically, a source region and drain region of the n-type transistor are formed in the p-doped region. As examples, the source region 32 and drain region 34 of the n-type FET are formed in the p-doped region (e.g., p-doped semiconductor substrate 20). In operation 304, a p-type transistor is formed in an n-doped region in the substrate. More specifically, a source region and drain region of the p-type transistor are formed in the n-doped region. As examples, the source region 42 and drain region 44 of the pFET are formed in the n-well 22 in the semiconductor substrate 20. The source region (e.g., source region 42) of the p-type transistor, the n-doped region in the substrate (e.g., n-well 22), the p-doped region in the substrate (e.g., p-doped semiconductor substrate 20), and the source region (e.g., source region 32) of the n-type transistor form a PNPN structure (e.g., a parasitic SCR structure) in the substrate.

In operation 306, metallization layers including metal lines and vias are formed on the substrate. The metallization layers connect the PNPN structure of the n-type and p-type transistors between a ground node and a power node, and the metallization layers include a ballast resistor electrically connected in series with the PNPN structure between the power node and the ground node. As examples, ballast resistor 50, 52 is electrically connected in series with the PNPN structure between the power node VCC and the ground node GND. The ballast resistor can be or include metal lines and vias in the metallization layers. The metal lines and vias that form the ballast resistor can be formed with various geometries (e.g., lengths of metal lines, including a serpentine pattern of one or more metal lines in one or more metallization layers) and/or materials to achieve a target resistance. The ballast resistor can be greater than 2 Ohms (e.g., 5 Ohms or more, such as 50 Ohms or more).

A person having ordinary skill in the art will readily understand that various processing to form the components formed by the method 300 of FIG. 3 can be implemented by doping a substrate, such as by implantation and/or in situ during epitaxial growth, that may be performed according to any appropriate sequence. For example, various components formed by the method 300 that are illustrated as being formed in different operations may be formed simultaneously or in a different sequence from what is illustrated. Various other features of the SEL mitigation techniques implemented by the method 300 can be as described with respect to and illustrated in any of FIGS. 1 and 2.

Figure 4:
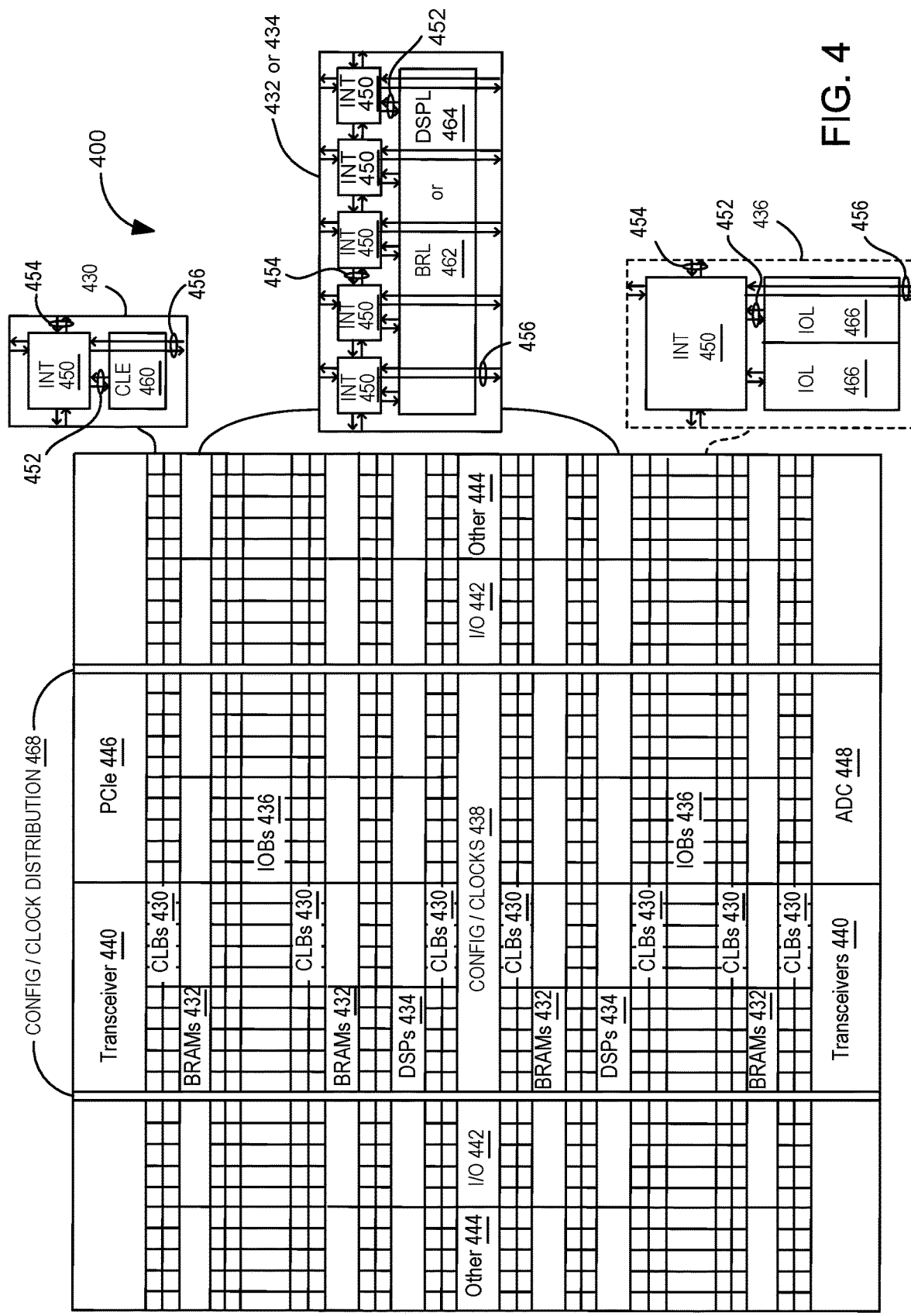
FIG. 4 is a field programmable gate array (FPGA) of a programmable integrated circuit (IC) that may implement SEL mitigation techniques according to some examples.

FIG. 4 illustrates a field programmable gate array (FPGA) of a programmable integrated circuit (IC) 400 that may implement SEL mitigation techniques, such as described above, according to some examples. The programmable IC 400 is implemented on a semiconductor substrate, such as typically included in a die or chip. The various circuits formed in the programmable IC 400 can be formed of n-type FETs and p-type FETs in the semiconductor substrate.

The programmable IC 400 includes a large number of different programmable tiles including configurable logic blocks ("CLBs") 430, random access memory blocks ("BRAMs") 432, signal processing blocks ("DSPs") 434, input/output blocks ("IOBs") 436, configuration and clocking logic ("CONFIG/CLOCKS") 438, digital transceivers 440, specialized input/output blocks ("I/O") 442 (e.g., configuration ports and clock ports), and other programmable logic 444 such as digital clock managers, system monitoring logic, and so forth. The FPGA can also include PCIe interfaces 446, analog-to-digital converters (ADC) 448, and the like.

In some FPGAs, each programmable tile can include at least one programmable interconnect element ("INT") 450 having connections to input and output terminals 452 of a programmable logic element within the same tile, as shown by examples included in FIG. 4. Each programmable interconnect element 450 can also include connections to interconnect segments 454 of adjacent programmable interconnect element(s) in the same tile or other tile(s). Each programmable interconnect element 450 can also include connections to interconnect segments 456 of general routing resources between logic blocks (not shown). The general routing resources can include routing channels between logic blocks (not shown) comprising tracks of interconnect segments (e.g., interconnect segments 456) and switch blocks (not shown) for connecting interconnect segments. The interconnect segments of the general routing resources (e.g., interconnect segments 456) can span one or more logic blocks. The programmable interconnect elements 450 taken together with the general routing resources implement a programmable interconnect structure ("programmable interconnect") for the illustrated FPGA.

In an example implementation, a CLB 430 can include a configurable logic element ("CLE") 460 that can be programmed to implement user logic plus a single programmable interconnect element ("INT") 450. A BRAM 432 can include a BRAM logic element ("BRL") 462 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 434 can include a DSP logic element ("DSPL") 464 in addition to an appropriate number of programmable interconnect elements. An IOB 436 can include, for example, two instances of an input/output logic element ("IOL") 466 in addition to one instance of the programmable interconnect element 450. As will be clear to those of skill in the art, the actual I/O pads connected, for example, to the input/output logic element 466 typically are not confined to the area of the input/output logic element 466.

In the pictured example, a horizontal area near the center of the die is used for configuration, clock, and other control logic. Vertical columns 468 extending from this horizontal area or column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic.

Note that FIG. 4 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 4 are purely exemplary. For example, in an actual FPGA, more than one adjacent row of CLBs is typically included wherever the CLBs appear, to facilitate the efficient implementation of user logic, but the number of adjacent CLB rows varies with the overall size of the FPGA.

The SEL mitigation techniques can be implemented in any block of the programmable IC 400. As an example, the example of FIGS. 1 and 2 can be implemented in the IOBs 436, BRAM 432, CLBs 430, and/or other blocks. Any combination of examples may be included in a single IC, such as the programmable IC 400 of FIG. 4.

While the foregoing is directed to specific examples, other and further examples may be devised without departing from the basic scope thereof, and the scope thereof is determined by the claims that follow.

What is claimed is:

1. A circuit comprising:
   a semiconductor substrate comprising a p-doped region and an n-doped region;
   a first transistor comprising an n+ doped source region disposed in the p-doped region of the semiconductor substrate;
   a second transistor comprising a p+ doped source region disposed in the n-doped region of the semiconductor substrate, the p+ doped source region, the n-doped region, the p-doped region, and the n+ doped source region forming a PNPN structure; and
   a ballast resistor in a metallization layer on the semiconductor substrate, the ballast resistor being electrically connected between a power node and the p+ doped source region, the ballast resistor further being electrically connected in series with the PNPN structure between the power node and a ground node.

2. The circuit of claim 1, wherein the ballast resistor has a resistance greater than 2 Ohms.

3. The circuit of claim 1, wherein the ballast resistor has a resistance greater than 5 Ohms.

4. The circuit of claim 1, wherein the ballast resistor has a resistance greater than 50 Ohms.

5. The circuit of claim 1, wherein each of the first transistor and the second transistor is a fin field effect transistor (FinFET).

6. A circuit comprising:
   a parasitic silicon controlled rectifier in a substrate, portions of complementary transistors being disposed in the substrate, the complementary transistors including an n-type transistor and a p-type transistor, regions of the complementary transistors forming at least a portion of the parasitic silicon controlled rectifier, the parasitic silicon controlled rectifier being electrically coupled between a power node and a ground node; and
   a ballast resistor in a metallization layer on the substrate, the ballast resistor being electrically coupled in series with the parasitic silicon controlled rectifier between the power node and the ground node, the ballast resistor being electrically connected between a p-type source region of the p-type transistor and the power node, the ballast resistor having a resistance greater than 2 Ohms.

7. The circuit of claim 6, wherein the resistance of the ballast resistor is greater than 5 Ohms.

8. The circuit of claim 6, wherein the resistance of the ballast resistor is greater than 50 Ohms.

9. The circuit of claim 6, wherein the complementary transistors include:
   the n-type transistor has an n-type source region and an n-type drain region disposed in a p-region of the substrate; and
   the p-type transistor has the p-type source region and a p-type drain region disposed in an n-region of the substrate, the n-type source region, the p-region, the n-region, and the p-type source region forming the parasitic silicon controlled rectifier.

10. The circuit of claim 6, wherein the ballast resistor includes a serpentine metal pattern in the metallization layer on the substrate.

11. The circuit of claim 6, wherein the complementary transistors are fin field effect transistors (FinFETs).

12. A circuit comprising:
    an n-type transistor comprising an n-type source region disposed in a p-type region in a substrate;
    a p-type transistor comprising a p-type source region disposed in an n-type region in the substrate, the n-type region abutting the p-type region, the p-type source region, the n-type region, the p-type region, and the n-type source region forming a parasitic silicon controlled rectifier in the substrate; and
    a ballast resistor in a metallization layer on the substrate, the ballast resistor having a resistance greater than 2 Ohms, the ballast resistor and the parasitic silicon controlled rectifier being electrically coupled in series between a power node and a ground node, the ballast resistor being electrically connected between the p-type source region and the power node.

13. The circuit of claim 12, wherein the resistance of the ballast resistor is greater than 5 Ohms.

14. The circuit of claim 12, wherein the resistance of the ballast resistor is greater than 50 Ohms.

* * * * *